United States Patent
Bheemanna et al.

(10) Patent No.: US 9,322,876 B2
(45) Date of Patent: Apr. 26, 2016

(54) CONTROL TEST POINT FOR TIMING STABILITY DURING SCAN CAPTURE

(71) Applicant: International Business Machines Corporation, Armonk, NY (US)

(72) Inventors: Purushotam Bheemanna, Bangalore (IN); Raghu G. GopalaKrishnaSetty, Bangalore (IN); Pavan K. Guntipalli, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/826,423

(22) Filed: Aug. 14, 2015

(65) Prior Publication Data
US 2015/0346281 A1    Dec. 3, 2015

Related U.S. Application Data

(63) Continuation of application No. 14/025,293, filed on Sep. 12, 2013.

(51) Int. Cl.
*G01R 31/3177* (2006.01)
*G01R 31/3185* (2006.01)

(52) U.S. Cl.
CPC .... *G01R 31/3177* (2013.01); *G01R 31/318552* (2013.01); *G01R 31/318575* (2013.01)

(58) Field of Classification Search
CPC .............. G06F 9/3869; G01R 31/318541; G01R 31/318552; G01R 31/3177
See application file for complete search history.

(56) References Cited

U.S. PATENT DOCUMENTS

| 6,028,983 | A | 2/2000 | Jaber | |
| 6,185,710 | B1 * | 2/2001 | Barnhart | G01R 31/318541 714/727 |
| 7,058,868 | B2 | 6/2006 | Guettaf | |
| 7,225,374 | B2 * | 5/2007 | Burdine | G01R 31/318569 714/726 |

(Continued)

FOREIGN PATENT DOCUMENTS

| CN | 201043981 Y | 4/2008 |
| JP | 2002181900 A | 6/2002 |
| JP | 4218845 B1 | 2/2009 |

OTHER PUBLICATIONS

Devta-Prasanna, N., et al., "Clock Gate Test Points," 2010 IEEE Test Conference, pp. 1-10. © 2010 IEEE Digital Object Identifier: 10.1109/TEST.2010.5699208.

(Continued)

*Primary Examiner* — Phung M Chung
(74) *Attorney, Agent, or Firm* — Nicholas D. Bowman; Steven Meyers (57) ABSTRACT

A scan chain of an integrated circuit is disclosed, including a plurality of scannable storage elements and a control test point having a scan latch and an integrated clock gate (ICG) with clock, functional enable (FE) and scan enable (SE) inputs, and a gated clock output. The ICG may respond to an SE input active state, in a serial scan mode allowing the gated clock output to change. The ICG may also be operated in a scan capture mode, responding to an SE input inactive state, in which the gated clock output is inhibited from changing in response to a low FE input level. The ICG's gated clock output may be coupled to the scan latch clock input, which may hold its data output at a fixed level in response to ICG's gated clock output being inhibited from changing during the scan capture operation.

4 Claims, 4 Drawing Sheets

(56) References Cited

U.S. PATENT DOCUMENTS

| | | | |
|---|---|---|---|
| 7,383,481 B2 | 6/2008 | Warren et al. | |
| 7,644,333 B2 | 1/2010 | Hill et al. | |
| 7,752,513 B2 * | 7/2010 | Namura | G01R 31/31725 714/25 |
| 7,810,003 B2 | 10/2010 | Seong | |
| 7,872,490 B2 * | 1/2011 | Fukunaga | G01R 31/31721 326/16 |
| 7,895,488 B1 | 2/2011 | Bertanzetti | |
| 7,917,823 B2 * | 3/2011 | Dehnert | G01R 31/318555 702/117 |
| 7,987,401 B2 | 7/2011 | Pandey | |
| 8,205,125 B2 | 6/2012 | Hales et al. | |
| 8,479,068 B2 * | 7/2013 | Periasamy | G01R 31/318552 714/731 |
| 2003/0009714 A1 | 1/2003 | Evans | |
| 2003/0115525 A1 | 6/2003 | Hill et al. | |
| 2005/0039095 A1 | 2/2005 | Guettaf | |
| 2008/0092093 A1 | 4/2008 | Balakrishnan et al. | |
| 2010/0122116 A1 | 5/2010 | Floyd et al. | |
| 2011/0219277 A1 | 9/2011 | Jen et al. | |
| 2015/0074477 A1 | 3/2015 | Bheemanna et al. | |

OTHER PUBLICATIONS

Sankaralingam, R., et al., "Inserting Test Points to Control Peak Power During Scan Testing," Proceedings of the 17th IEEE International Symposium on Defect and Fault Tolerance in VLSI Systems, 2002, 9 pages. © 2002 IEEE Digital Object Identifier: 10.1109/DFTVS.2002.1173510.

* cited by examiner

CONTROL TEST POINT FOR TIMING STABILITY DURING SCAN CAPTURE

TECHNICAL FIELD

The present disclosure relates to test circuits and techniques for integrated circuits (ICs). In particular, this disclosure relates to scan testing elements used in the testing of digital ICs which include sequential storage elements.

BACKGROUND

After an integrated circuit (IC) is manufactured, it must be tested to ensure that it functions properly. Scan testing can be an efficient method for determining which portions of an IC are working properly. ICs are generally tested by providing known patterns to particular inputs of the IC and analyzing the resultant outputs from the IC. If the IC provides the proper outputs in response to the provided inputs, the manufacturer is assured that the IC is working properly.

The insertion of test points within an IC may assist in improving the testability of ICs that are difficult to test, and may reduce the number of test patterns and test time required. There are two basic types of test points that are used in IC testing: control test points (CTPs) and observe test points (OTPs). Control test points may be used to make a difficult to control circuit node more easily controllable and observe test points may be used to make a difficult to observe node easier to observe by adding additional logic to the design. Control test points may also add performance overhead to the design.

SUMMARY

Various aspects of the present disclosure may be particularly useful for preventing logic state changes (toggling) of control test point (CTP) outputs within a scan chain of an IC. An IC designed according to embodiments of the present disclosure may also realize limited test pattern size, chip area and chip power requirements as a result of limiting CTP output toggling.

Embodiments are directed towards a scan chain of an integrated circuit (IC). The scan chain may have a plurality of scannable storage elements designed to receive an output state of combinational logic during a scan capture operation, and a control test point (CTP).

The CTP may include a first integrated clock gate (ICG). The ICG may have a first clock input, and a first gated clock output, a first functional enable (FE) input, and a scan enable (SE) input. The first ICG may be configured to operate, in response to an active state of the first SE input, in a serial scan mode that allows the gated clock output to change in response to data received by the first SE input during a serial scan operation. The first ICG may also be configured to operate in response to an inactive state of the first SE input, in a scan capture mode in which the gated clock output is inhibited from changing during the scan capture operation in response to the FE input being held at a low logic level.

The CTP may also have a scan latch having a clock input coupled to the gated clock output of the first ICG and a data output, the scan latch configured to hold the data output at a fixed logic level in response to the gated clock output of the first ICG being inhibited from changing during the scan capture operation.

Other embodiments are directed to a scan chain of an integrated circuit (IC). The scan chain may have a plurality of scannable storage elements designed to receive an output state of combinational logic during a scan capture operation, and a control test point (CTP). The CTP may have a scan latch having a clock input, a data input, a data output coupled to the data input, a scan enable (SE) input, a scan data (SI) input, and a test mode input. The scan latch may be configured to operate in response to an active state of the SE input, in a serial scan mode that allows the data output to change in response to data received by the SI input during a serial scan operation. The scan latch may also be configured to operate in response to an inactive state of the SE input, in a scan capture mode by holding the data output at a fixed logic level during the scan capture operation.

Other embodiments are directed towards a method for using a scan chain of an integrated circuit (IC). The method may receive, at a first integrated clock gate (ICG) and at a scan latch, a scan enable (SE) signal that indicates one member of a set of modes consisting of: a scan capture mode and a serial scan mode.

The method may also include, in response to the SE signal indicating the scan capture mode, maintaining a logic level of a gated clock output of the first ICG in response to a functional enable (FE) input of the first ICG being held at a low logic level, maintaining a clock input of the scan latch at a low logic level, and maintaining a data output of the scan latch at a known logic level.

The method may also include, in response to the SE signal indicating the serial scan mode, changing the logic level of the gated clock output of the first ICG in response to the SE signal of the first ICG, clocking the scan latch using the gated clock output of the first ICG, and changing the logic level of the data output of the scan latch, in response to the logic level of an SI input of the scan latch.

Aspects of the various embodiments may be used to reduce or eliminate unnecessary logic state changes of a CTP output within a scan path of an IC, and may reduce or eliminate the need for additional logic to compensate for the effects of unnecessary CTP output changing. Aspects of the various embodiments may also be particularly useful for reducing test vector count and improving fault coverage of an IC.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of embodiments of the disclosure and do not limit the invention.

In the drawings and the Detailed Description, like numbers generally refer to like components, parts, steps, and processes.

DETAILED DESCRIPTION

Certain embodiments of the present disclosure can be appreciated in the context of a control test point (CTP) configured to control a scan enable input to an ICG. Such CTPs may arrest toggling of the ICG scan enable input during a scan capture operation. While not necessarily limited thereto, embodiments discussed in this context can facilitate an understanding of various aspects of the disclosure. Certain embodiments may also be directed towards other equipment and associated applications, such as arresting the toggling of a high-fanout control node during a scan capture operation. Embodiments may also be directed towards controlling an asynchronous set or reset input to a clocked storage element.

While all figures illustrate the principles and features of the present disclosure, additional embodiments may include modifications to and variations of circuitry depicted, within the scope and spirit of the disclosure.

Various embodiments of the present disclosure relate to the reduction or elimination of CTP output net toggles (timing arcs) that may be created during a scan capture operation by CTPs designed into a scan chain of an IC, and may thereby simplify scan chain timing closure. The disclosed CTP can thereby have an output that remains at a fixed value during a scan capture operation. While the disclosure is not necessarily limited to such embodiments, various aspects of the invention may be appreciated through a discussion of various examples using this context.

Certain embodiments relate to the testing of ICs in order to provide acceptable fault coverage levels. As ICs have attained higher levels of integration with more circuit elements per die, the number of IC manufacturing defects has also increased, and achieving acceptably high manufacturing fault coverage levels has become more difficult. High fault coverage levels may be useful in ensuring the quality of manufactured ICs.

IC testing methodology may rely upon scan chains to achieve a level of fault coverage not achievable through the use of classical broadside test patterns. A scan chain may comprise a plurality of scannable storage elements designed to receive the output state of combinational logic during a scan capture operation. A scan chain may also be configured to allow serial scanning of data into and out of the scan chain during a serial scan operation. Data may enter and or leave the on-chip scan chain from a source and/or destination external to the IC during a serial scan operation.

Design for test (DFT) methodologies may include the insertion of control test points (CTPs) and observation test points (OTPs) into an IC design's scan chain, to increase the number of controllable and observable nodes, thereby improving the testability of the IC.

A CTP may provide a way to control a formerly difficult to control node by allowing the scanning of a logic value into the CTP through the scan chain. This value may appear at the CTP output, and be used to control a particular node. Similarly, an OTP may be used to provide a scan chain path through which a formerly unobservable node may be observed.

A testability metric of an IC under test may include the levels of controllability and observability of the nodes within the IC. Greater testability may be indicated by a greater number of circuit faults that can be tested (controlled and observed). Greater testability of an IC may lead to higher levels of fault coverage.

Possible design areas where fault coverage may be improved and which may benefit from insertion of a CTP include integrated clock gates (ICGs), asynchronous set/reset signals of latched elements, and high fanout control nets.

A CTP may include various types of clocked flip-flops or level-sensitive scan design (LSSD) latches, and may have inputs such as a clock, scan in, scan enable, data, test mode and a data output. A CTP can be inserted into the ICG's scan enable logic cone to improve test coverage by making a formerly uncontrollable node controllable through scan operations. A CTP may also be inserted into a design to control asynchronous set/reset signals of latched elements, or to allow control of high fanout control nets.

The CTP may be clocked during a scan capture operation, which may cause its output and any connected device inputs to toggle, creating timing arcs that may have to be timing closed. Closing timing on the CTP output path may require inserting additional inverters and/or buffers, and may cause an increase in area and/or power consumption of the design.

Timing closure is the process by which the logic and interconnect wiring within an IC design is modified to meet its overall timing requirements. Once an IC's logic functions and blocks are synthesized, interconnected, and a preliminary chip layout is completed, estimates of active circuit element (logic block) delays and wiring delays may be obtained. These estimates may be summed for the various delay paths through the logic, and compared to the design's timing specifications.

Timing closure may involve resolving discrepancies between a design's timing specifications and estimated delay timing of logic paths. Types of actions that may be taken to resolve timing discrepancies may include interchanging/swapping of logic blocks, repartitioning of hierarchical functions, and movement of logic elements within the chip floorplan. Various thicknesses and lengths of wiring, and re-driving of signals with buffers may also be used in an attempt to reconcile timing differences. Many of the design modifications may be handled by automated design tools, based on directives given by a designer. The term timing closure may also be used for the goal that is achieved, when such a design has reached the end of its design flow and its timing requirements are satisfied.

Various embodiments of the present disclosure relate to the elimination of CTP output net toggles (timing arcs) that may be created during a scan capture operation by CTPs designed into a scan chain, and thus embodiments may thereby simplify scan chain timing closure. The disclosed CTP can have an output that remains at a fixed value during a scan capture operation.

A scan chain according to embodiments relating to CTPs discussed herein may have improved test coverage and reduced test pattern overhead. An IC including a scan chain according to the embodiments may avoid increased circuit area usage and dynamic power consumption resulting from additional buffer/inverter placements necessary to correct timing issues created by CTP timing arcs.

Figure 1:
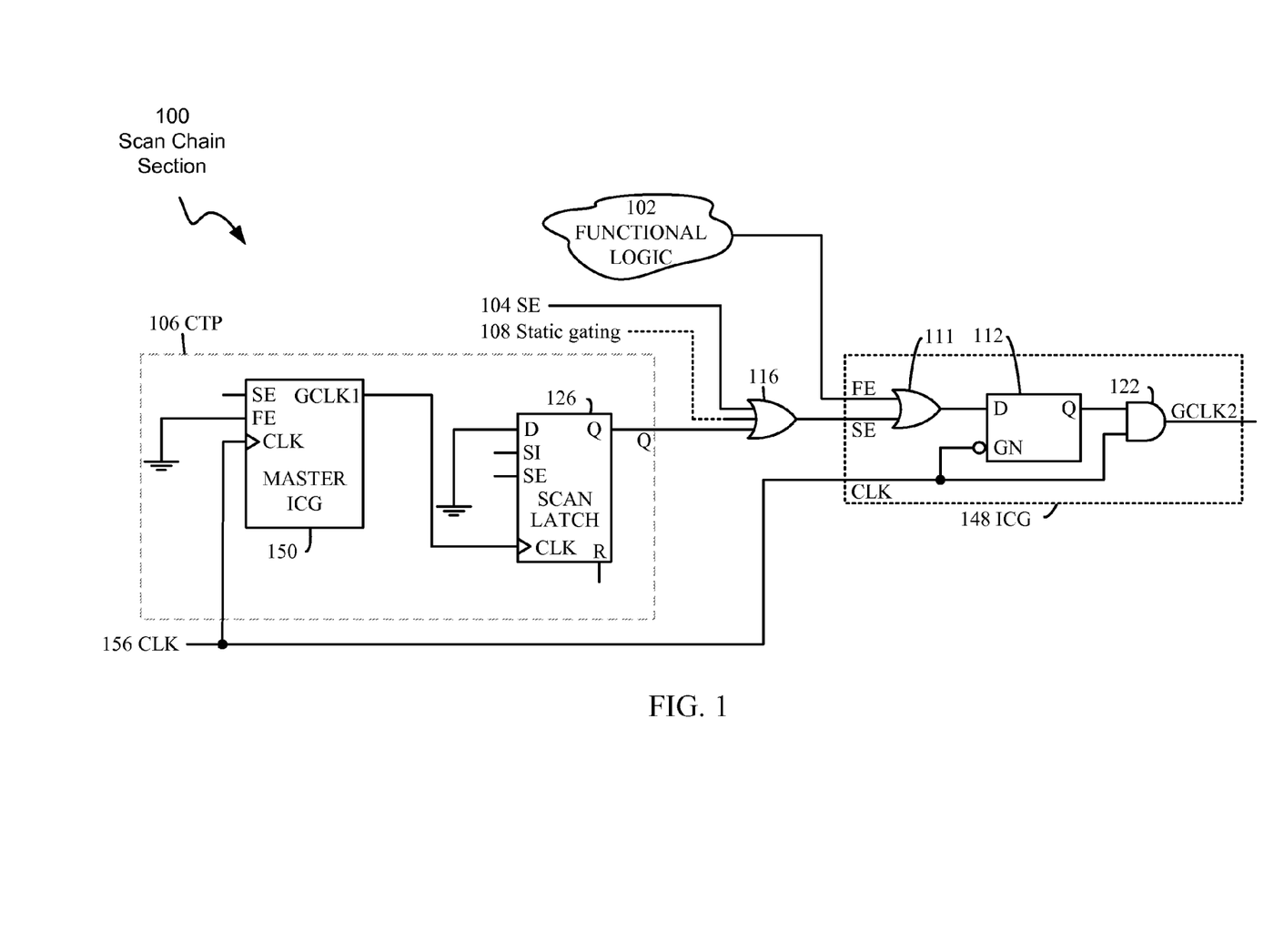
FIG. 1 is a schematic representation of a control test point (CTP) controlled by a Master (first) integrated clock gate (ICG), with the CTP controlling another (second) ICG, according to embodiments of the present disclosure.
Figure 2:
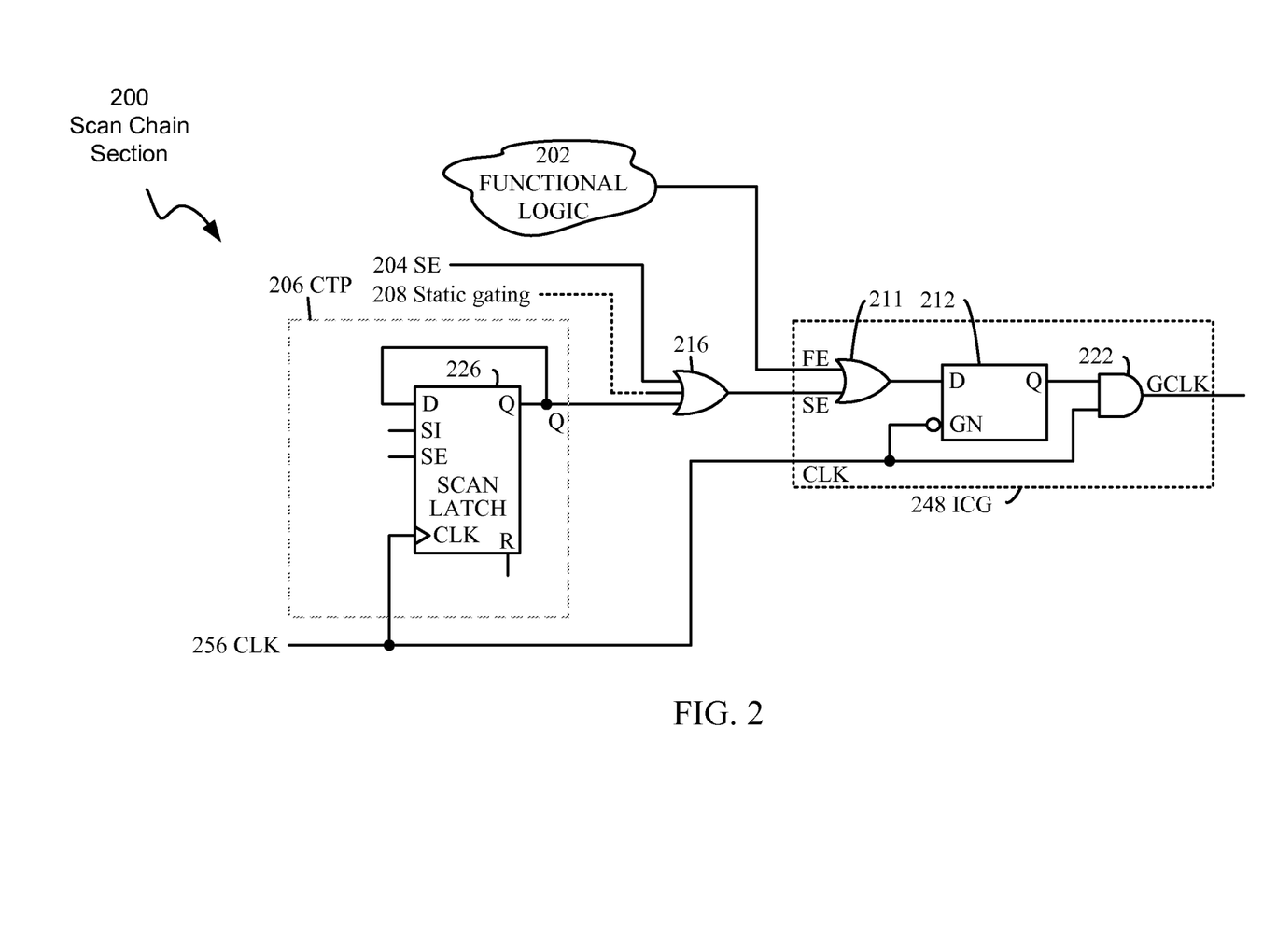
FIG. 2 is a schematic representation of a control test point (CTP) having its output tied to its data input, with the CTP controlling an ICG, according to embodiments.
Figure 3:
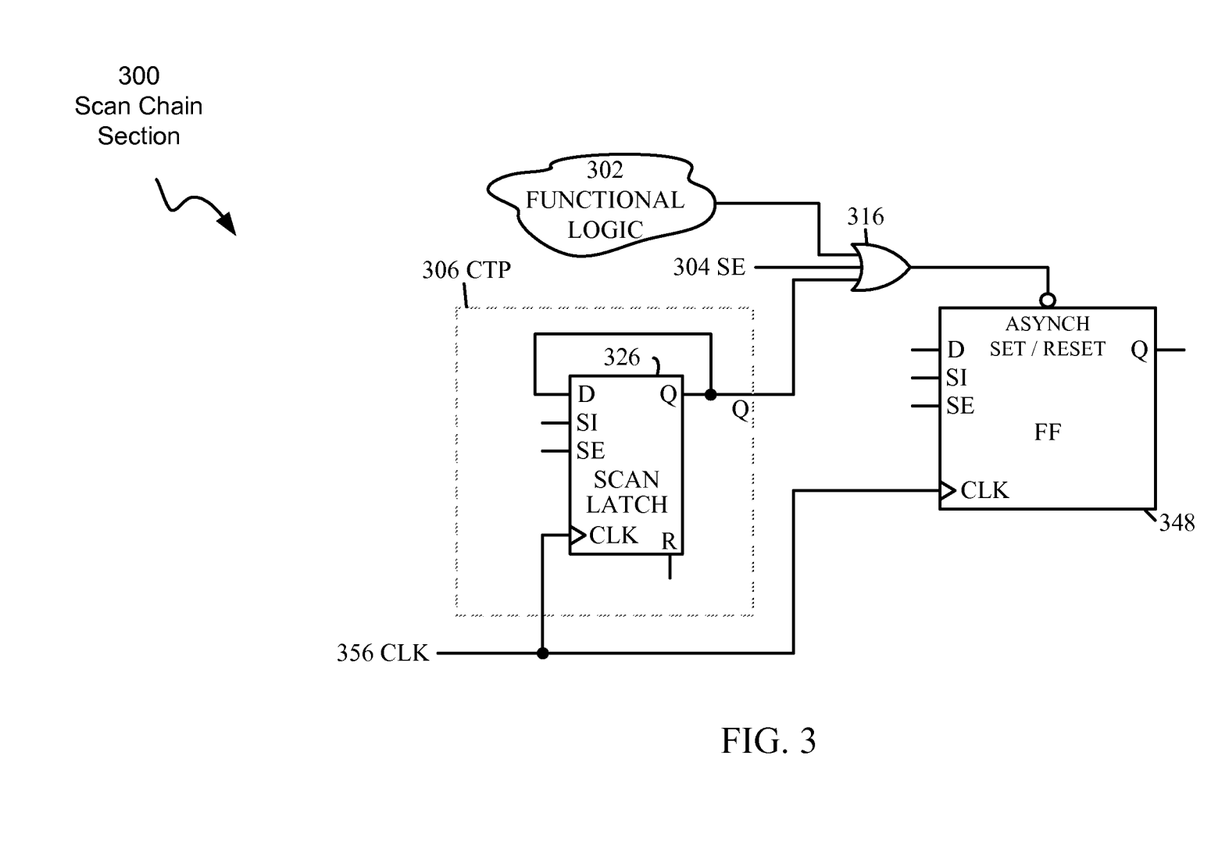
FIG. 3 is a schematic representation of a control test point (CTP) having its output tied to its data input, with the CTP controlling an asynchronous flip-flop, according to embodiments.

FIGS. 1, 2 and 3 depict embodiments of control test point architectures designed to arrest CTP output toggling during a scan capture operation. The figures depict a CTP in an application with an integrated clock gate (ICG) and/or flip-flop with an asynchronous set or reset input.

According to embodiments, an ICG may be used to enable or disable (gate) a clock signal to sections of logic within an IC. An ICG may be included in a scan chain and used to provide a clock signal that can be enabled and disabled in synchronization with an input clock signal.

Consistent with certain embodiments, the CTP and ICG can both function as data storage elements, capable of storing data received in a serial scan or scan capture operation, and presenting that data on an output.

FIG. 1 is a schematic that depicts a scan chain section 100 of an integrated circuit (IC) which may be used, during a scan capture operation, for preventing logic state changes on CTP

106 output Q from propagating to IC logic elements coupled to the 106 output Q, according to embodiments of the present disclosure.

The Master (first) ICG 150 of CTP 106 may include a gated clock output GCLK1 coupled to a clock input CLK of scan latch 126, which may be held at a stable logic state during a scan capture operation, according to embodiments. Holding the CLK input of scan latch 126 stable may result in CTP 106 output Q also remaining stable, which may further ensure that nodes coupled to the Q output of CTP 106, such as the SE input of ICG 148 are not toggled during a scan capture operation, according to embodiments. Toggling of such inputs during scan capture may cause timing issues, or the capture of incorrect logic values in the scan chain's clocked storage elements.

Scan chain section 100 may generally be operated in either a serial scan mode, or a scan capture mode. The SE input signal coupled to Master ICG 150 and to scan latch 126 may be used to select between the serial scan mode and the scan capture mode. For example, holding the SE signal in a logic high state may select the serial scan mode, and holding the SE signal in a logic low state may select the scan capture mode, according to embodiments. Some embodiments may use a different SE signal convention to select between the serial scan mode and the scan capture mode.

Integrated clock gates (ICGs) such as Master (first) ICG 150 may be generally useful within a scan chain for the generation of clock signals which may be gated. For example, if a section of logic within an IC has periods of inactivity, an IC designer may choose to couple its clock input to the gated clock output of an ICG, which may be selectively disabled in order to conserve power.

Through the connection of the GCLK1 output of ICG 150 to the CLK input of scan latch 126, Master ICG 150 may be used to hold clock input CLK of 126 at a stable logic state during a scan capture operation. ICG 150 may only change its GCLK1 output in response to either the scan enable SE input or the functional enable FE input being held to a high logic state when an active edge of a CLK 156 signal is received by ICG 150. The FE input of ICG 150 may be coupled to ground, and in a scan capture operation, the SE input may also be held to a low logic state.

In this configuration, the GCLK1 output may therefore be prevented from making a rising transition to a logic high state during a scan capture operation. An active edge of a clock signal, for example CLK 156, may be a rising edge that transitions from a low logic state to a high logic state. Some embodiments may include a falling clock edge as the active edge.

Scan latch 126 is a type of latch which may be used within a scan chain. A scan latch may be configured to receive and store data from the outputs of combinational logic, in a parallel configuration, through a D input, or from another similar scan latch, in a serial configuration, through an SI input.

During a scan capture operation, the CLK input of 126 may not transition to a logic high state, and therefore may not clock scan latch 126. In the absence of an active (rising) clock edge on CLK input of 126, output Q of scan latch 126, and thus, output Q of CTP 106, may remain stable during a scan capture operation, according to embodiments. Output Q of CTP 106 therefore may not be allowed to cause toggling (timing arcs) on nodes coupled to it, such as the SE input of ICG 148, consistent with embodiments of the disclosure. In some embodiments, nodes coupled to output Q of CTP 106 may include nodes configured to control a plurality of circuits, or nodes coupled to an asynchronous set or reset inputs of a flip-flop. Data input (D) of scan latch 126 may not be used in the present disclosure and therefore may be held at a logic 0 (tied to ground).

As configured in scan chain section 100, scan latch 126 may have an SI input that may be connected to the Q output of another scan latch in the scan chain. Scan latch 126 may also have an SE input coupled to the SE input of Master ICG 150, and to scan chain control logic. Scan latch 126 may have a test mode input R, which may be asserted to reset it asynchronously, forcing its Q output to a low logic state, regardless of whether it's being used in serial scan mode or scan capture mode.

Master ICG 150 may therefore be a useful device to maintain the logic state of the CLK input of scan latch 126, and subsequently the logic state of the Q output of scan latch 126, and of CTP 106 during a scan capture operation. The combination of Master ICG 150 and scan latch 126 results in a useful control test point (CTP 106) having a Q output that may be disabled during a scan capture operation, thus preventing disruption of the capture of correct data from combinational logic into the scan chain. For example, gated clock output GCLK2 of ICG 148 may be used to clock a section of logic, and if it was incorrectly enabled or disabled during a scan capture operation storage elements that it clocks may store incorrect logic states.

Master integrated clock generator (ICG) 150 is consistent with, and may have inputs, outputs, logical structure and function similar to (second) ICG 148. Functional logic 102 may represent a section of logic within the IC which may include combinational and/or clocked logic elements, and may have an output coupled to the FE input of ICG 148, which may allow the functional logic 102 to independently enable ICG 148.

CTP 106 output Q, SE input 104 and static gating signal 108 may be coupled to inputs of OR gate 116, which may allow each of these signals to be coupled to, and assert an active state on, the SE input of ICG 148. An active state of the SE input of ICG 148 may be a logic high level for scan chain section 100. An active state applied to the SE input of ICG 148 may cause its GCLK2 output to produce a clock signal, in response to the CLK input of ICG 148.

OR gate 116 may ensure that the ICGs, flip-flops or latches being driven by the Q output of CTP 106 may act as elements gated (controlled) by the CTP 106 during a scan capture operation and as non-gated storage elements during a serial scan operation.

Static gating signal 108 may be an optional input which may be driven from a chip-level I/O, and may be used by hardware external to the IC for static gating of the scan chain. SE 104 may be an input generated by scan chain control logic, and may be used to enable ICG 148 output GCLK2 during a serial scan operation.

ICG 148 may be useful in providing a synchronous gated clock output signal GCLK2, in response to CLK input and its enable signals FE and SE. GCLK2 may be distributed to one or more sections of logic that make use of clocks that can be enabled and disabled (gated).

The FE and SE inputs of ICG 148 are received by OR gate 111, which may produce a logic high output in response to either input being held at a logic high state. The OR gate 111 output is coupled to the D input of flip-flop 112, which is clocked by an inverted CLK input of ICG 148. The Q output of flip-flop 112 is a synchronous representation of the most recent D input, and is used to gate the CLK input of ICG 148. When the flip-flop 112 Q output is at a high logic state, (representing one or more active enable inputs received), AND gate 122 is enabled, and GCLK2 may output a clock signal synchronous with ICG 148 input CLK.

In some embodiments, the CTP 106 Q output may be coupled to a net configured to control a plurality of logic circuits. The Q output being held at a fixed logic level may maintain the logic level of the net controlling a plurality of logic circuits, thus eliminating signal toggling (timing arcs) from propagating from CTP 106 output Q to other logic sections.

FIG. 1 depicts a single scan latch 126, however, various embodiments may include a plurality of scan latches 126, which may be connected to one or more Master ICG 150. The present disclosure is not limited to the type of gating and interconnections depicted in FIG. 1, and may include other types of gating including but not limited to a MUX or another combination of logic gates.

According to embodiments, a scan chain constructed by gating the CLK input of scan latch 126 with the GCLK1 output of a (Master) ICG 150 may eliminate logic state changes of the scan latch 126 output Q during a scan capture operation.

When scan chain section 100 is used during a serial scan operation, the SE input of ICG 150 may be active, for example held at a high logic state, which may allow the gated clock output GCLK1 to change in response to a clock signal received by the ICG 150 CLK input. The active state of the SE input of ICG 150 may be a logic 1 in one embodiment, and may be a logic 0 in another embodiment.

GCLK1 changing may result in scan latch 126 being clocked. When scan latch 126 is clocked and the SE signal of scan latch 126 is in an active state, scan latch 126 may store the logic value received by its SI input. In response to storing the logic value on its SI input, the Q output of scan latch 126 may change. Scan latch 126 data output Q changing may cause the SE input of ICG 148 to change, which may result in gated clock output GCLK2 becoming enabled or disabled.

A logic designer may appreciate that a variety of different types and configurations of logic elements may be used to affect a function described in the present disclosure. The embodiments described herein provide illustrative examples of logic configurations, but do not limit the disclosure in any way. A logic designer may also appreciate that other types logic functions besides ICGs, high fanout control nets, and asynchronous flip-flop set/reset inputs may also require stability during a scan capture operation; these logic function types were provided as examples, but do not limit applications of the present disclosure.

Embodiments consistent with FIG. 1 may be useful in allowing control test point outputs and nodes connected to them to change in a serial scan mode, while holding the CTP output stable during a scan capture mode.

FIG. 2 is a schematic that depicts a scan chain section 200 of an integrated circuit (IC) which may be used, during a scan capture operation, for preventing logic state changes on CTP 206 output Q from propagating to IC logic elements coupled to the 206 output Q, according to embodiments of the present disclosure.

CTP 206 may include a scan latch 226 having a data output Q coupled to its data input (D), which may be used to hold the Q output in a stable logic state during a scan capture operation, according to embodiments.

Holding the data output Q of scan latch 226 stable may result in CTP 206 output Q also remaining stable, which may further ensure that nodes coupled to CTP 206 output Q, such as the SE input of ICG 248, are not toggled during a scan capture operation, according to embodiments. Toggling of such inputs during scan capture may cause timing issues, or the capture of incorrect logic values in the scan chain's clocked storage elements.

Scan chain section 200 may generally be operated in either a serial scan mode, or a scan capture mode. The SE input signal coupled to scan latch 226 may be used to select between the serial scan mode and the scan capture mode. For example, holding the SE signal in a logic high state may select the serial scan mode, and holding the SE signal in a logic low state may select the scan capture mode, according to embodiments. Some embodiments may use a different SE signal convention to select between the serial scan mode and the scan capture mode.

The coupling of the data input D of scan latch 226 to its data output Q may be used to hold the Q output in a stable logic state during a scan capture operation, according to embodiments. Scan latch 226 may only change its Q output in response to either an SI input (when the scan enable SE input is held in an active state) or a D input, (when the SE input is held in an inactive state).

Holding the SE input of scan latch 226 at a low logic state may be used to select a scan capture mode. In this mode, scan latch 226 may receive data from its D input, but may not receive data from its SI input. The connection of the scan latch 226 D input directly to its Q output may feed back the logic state of the Q output directly to the D input, which may not be allowed to change in a scan capture mode.

An active, for example, logic high state may be used in conjunction with scan chain section 200 may select a serial scan mode. In this mode, scan latch 226 may receive data from its SI input, but may not receive data from its D input. The SI input may be connected to another scan latch within the scan chain, and may be allowed to change freely during a serial scan operation. Data output Q, therefore may also be allowed to change, which may result in the SE input of ICG 248 changing. This may result in the GCLK output of ICG 248 either being enabled or disabled.

Functional logic 202, OR gate 216, and ICG 248 are consistent with functional logic 102, OR gate 116 and ICG 148 (FIG. 1), respectively, in structure, function and interconnection.

FIG. 3 is a schematic that depicts a scan chain section 300 of an integrated circuit (IC) which may be used, during a scan capture operation, for preventing logic state changes on CTP 306 output Q from propagating to IC logic elements coupled to the 306 output Q, according to embodiments of the present disclosure.

Scan latch 326, CTP 306, OR gate 316, and functional logic 302 are consistent with scan latch 226, CTP 206, OR gate 216, and functional logic 202 (as described in reference to FIG. 2), respectively, in structure, function and interconnection.

Data output Q of scan latch 326 may be coupled through OR gate 316 to the asynchronous set or reset input of flip-flop 348. During a scan capture mode, output Q of scan latch 326 may be prevented from changing state (toggling) and thereby changing the state of the asynchronous set or reset input of flip-flop 348. Changing the logic state of an asynchronous set or reset input of a flip-flop during a scan capture operation may result in incorrect values being captured in the flip-flop, or timing issues that may need to be corrected by the addition of extra logic elements such as inverters and buffers.

Functioning in a manner consistent with scan latch 226, scan latch 326 may prevent changes of state of the Q output of CTP 306 during a scan capture operation, and thereby prevent the asynchronous set or reset input of flip-flop 348 from toggling therein. Also consistent with the function of scan latch 226, the output Q of scan latch 326 may be allowed to change during a serial scan operation, which may allow flip-flop 348 to be either set or reset, which may change the logic state of flip-flop 348 output Q.

Figure 4:
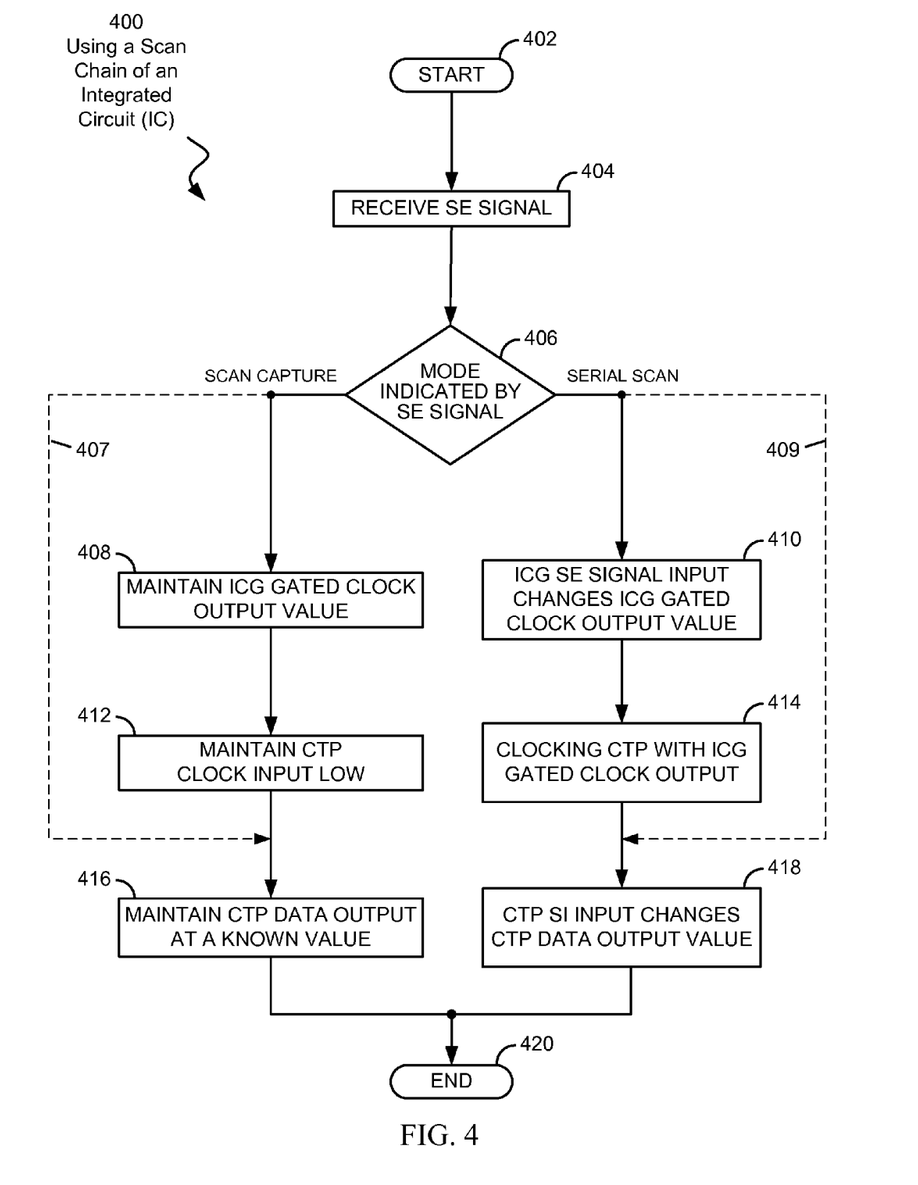
FIG. 4 is a flow diagram illustrating a method for using a scan chain of an integrated circuit (IC), according to embodiments.

FIG. 4 is a flow diagram illustrating a method for using a scan chain of an integrated circuit (IC) 400, according to embodiments.

The process 400 moves from start 402 to operation 404. At operation 404, the Master (first) ICG and the CTP receive an SE signal from the scan chain. The SE signal may be common to a plurality of elements within the scan chain, and may be broadcast to them by scan chain control logic. The process then moves to decision 406, where the SE signal is interpreted, and one of two modes is chosen; either a scan capture mode or a serial scan mode. The interpretation of the SE signal may be performed within the logic elements of the ICG and the CTP.

If a scan capture mode is indicated, the process then moves to operation 408. Operation 408 involves maintaining the logic level of the Master (first) ICG 150 (FIG. 1) gated clock output GCLK1 in response to its FE input being held at a low logic level. When the SE signal is at a low logic level, the Master ICG 150 is configured to receive the FE input as a data input.

The process then moves to operation 412, where a CTP clock input CLK is maintained at a low logic level, as it is coupled to the gated clock output GCLK1 of ICG 150 (FIG. 1). The process then moves to operation 416, where the CTP data output is maintained at a known logic level, as a result of no active clock edge being received by the CTP, and thus no data being clocked into the CTP and being presented at its output. The process 400 may end at block 420.

If a serial scan operation is indicated, the process then moves to operation 410. Operation 410 involves the changing of the Master ICG gated clock output logic level in response to the SE input of the (first) Master ICG. If the SE input is a logic high value when a clock edge is received by the Master ICG, then the gated clock output will be allowed to output a clock signal, synchronous with the ICG's clock input. The process then moves to operation 414, where the CTP is clocked with the gated clock output of the ICG, which is directly coupled to the CTP's CLK input. The process then moves to operation 418 where the CTP data output Q logic level may be changed in response to an SI input change. The scan latch may respond to its SE input being held at a logic high state by receiving the value on the SI input and presenting it on its Q output. The process 400 may end at block 420.

Operations 408, 412, 410, and 414 are consistent with embodiments of the present disclosure that may include a Master (first use) ICG, such as Master ICG 150 (FIG. 1). These particular operations may pertain to the function of the Master ICG.

A process consistent with embodiments not including a Master ICG, such as depicted in FIG. 2, 3, may not include operations 408, 412, 410, and 414, and may instead move directly from decision 406 to either operation 416 or operation 418, following paths 407 and 409 respectively, based upon the mode indicated by the SE signal in decision block 406.

Although the present invention has been described in terms of specific embodiments, it is anticipated that alterations and modifications thereof may become apparent to those skilled in the art. Therefore, it is intended that the following claims be interpreted as covering all such alterations and modifications as fall within the true spirit and scope of the invention.

What is claimed is:

1. A method for operating a scan latch of an integrated circuit scan chain, the method comprising:
    latching, in a first integrated clock gate (ICG), in response to receiving a clock signal at a clock input of the first ICG, a first logical value equal to a logical value of a scan enable (SE) input of the first (ICG), the first logical value indicating a scan capture mode;
    maintaining, in response to a functional enable (FE) input of the first ICG being coupled to ground, a first logic state on a gated clock output of the first ICG;
    holding, using the gated clock output of the first ICG that is electrically connected to a clock input of the scan latch, the first logic state at the clock input of the scan latch; and
    maintaining, in response to holding the first logic state at the clock input of the scan latch, a data output of the scan latch at a second logic state.

2. The method of claim 1, wherein maintaining the data output of the scan latch at the second logic state includes maintaining a logic state of a scan enable (SE) input of a second ICG coupled to the data output of the scan latch.

3. The method of claim 1, wherein maintaining the data output of the scan latch at the second logic state includes maintaining a logic state of at least one member of the group of inputs consisting of: an asynchronous set input of a flip-flop and an asynchronous reset input of the flip-flop coupled to the data output of the scan latch.

4. The method of claim 1, wherein maintaining the data output of the scan latch at the second logic state includes maintaining a logic state of a net configured to control a plurality of logic circuits coupled to the data output of the scan latch.

* * * * *